(12) United States Patent
Xue et al.

(10) Patent No.: US 9,685,467 B2
(45) Date of Patent: Jun. 20, 2017

(54) ARRAY SUBSTRATE AND MANUFACTURING METHOD THEREOF, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jing Xue, Beijing (CN); Hongjun Yu, Beijing (CN); Hong Zhu, Beijing (CN); Hao Wu, Beijing (CN); Ziwei Cui, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/769,761

(22) PCT Filed: Mar. 19, 2015

(86) PCT No.: PCT/CN2015/074565
§ 371 (c)(1),
(2) Date: Aug. 21, 2015

(87) PCT Pub. No.: WO2016/058330
PCT Pub. Date: Apr. 21, 2016

(65) Prior Publication Data
US 2016/0254288 A1    Sep. 1, 2016

(30) Foreign Application Priority Data
Oct. 16, 2014 (CN) .......................... 2014 1 0549863

(51) Int. Cl.
*H01L 27/12* (2006.01)
*H01L 21/77* (2017.01)
*G02F 1/1368* (2006.01)

(52) U.S. Cl.
CPC .......... *H01L 27/1244* (2013.01); *H01L 21/77* (2013.01); *H01L 27/12* (2013.01); *H01L 27/1262* (2013.01); *G02F 1/1368* (2013.01)

(58) Field of Classification Search
None
See application file for complete search history.

(56) References Cited

U.S. PATENT DOCUMENTS

| 6,633,359 | B1   | 10/2003 | Zhang et al. |
| 7,531,454 | B2 * | 5/2009  | Yoo ..................... H01L 27/1214 |
|           |      |         | 438/151 |

(Continued)

FOREIGN PATENT DOCUMENTS

| CN | 1707340 A | 12/2005 |
| CN | 101609236 | 12/2009 |

(Continued)

OTHER PUBLICATIONS

International Search Report and Written Opinion with English Language Translation, dated Jun. 26, 2015, Application No. PCT/CN2015/074565.

(Continued)

*Primary Examiner* — Johannes P Mondt
(74) *Attorney, Agent, or Firm* — Blakely Sokoloff Taylor & Zafman LLP

(57) ABSTRACT

Embodiments of the present invention disclose an array substrate and a manufacturing method thereof, a display device, which relates to the display field, and can increase transmittance of the product, and also has improvement effect to defects such as crosstalk, flicker, etc. An embodi- (Continued)

ment of the present invention provides an array substrate, comprising: a substrate, a data line, a gate line, a thin film transistor and a pixel electrode formed on the substrate, the thin film transistor comprises a gate insulating layer, a part of the gate insulating layer corresponding to a light-transmissive area of a pixel is removed.

6 Claims, 3 Drawing Sheets

(56) References Cited

U.S. PATENT DOCUMENTS

| | | | | |
|---|---|---|---|---|
| 7,760,309 | B2* | 7/2010 | Ahn | G02F 1/133555 |
| | | | | 349/141 |
| 2005/0087742 | A1* | 4/2005 | Chang | G02F 1/1362 |
| | | | | 257/72 |
| 2005/0270454 | A1 | 12/2005 | Ahn et al. | |
| 2006/0164576 | A1* | 7/2006 | Aoki | G02F 1/133514 |
| | | | | 349/114 |
| 2007/0146566 | A1* | 6/2007 | Hosoya | G02F 1/1362 |
| | | | | 349/43 |
| 2009/0059144 | A1 | 3/2009 | Lin et al. | |

FOREIGN PATENT DOCUMENTS

| | | |
|---|---|---|
| CN | 101609236 A | 12/2009 |
| CN | 101752306 | 6/2010 |
| CN | 104409483 | 3/2015 |
| JP | H06124890 A | 5/1994 |

OTHER PUBLICATIONS

Office Action in Chinese Application No. 201410549863.4 dated Oct. 8, 2016, with English translation. 10 pages.

* cited by examiner

-- PRIOR ART --

-- PRIOR ART --

ARRAY SUBSTRATE AND MANUFACTURING METHOD THEREOF, DISPLAY DEVICE

FIELD OF THE INVENTION

The present invention relates to display field, particularly to an array substrate and manufacturing method thereof, and a display device.

BACKGROUND OF THE INVENTION

The liquid crystal display has developed rapidly, and has occupied the mainstream of the display field at present, which is widely applied in products such as mobile phones, tablet computers, televisions, displays, lap tops, digital photo frames and navigators.

The advanced-super dimensional switching (ADS) technology is an emerging technology in the field of liquid crystal display, which forms a multi-dimensional electric field through a parallel electric field generated at edge of a pixel electrode or a common electrode within the same plane and a longitudinal electric field generated between the pixel electrode and the common electrode, such that all oriented liquid crystal molecules between the pixel electrode and the common electrode within a liquid crystal cell, and directly above the pixel electrode or the common electrode can generate rotation conversion, thereby improving working efficiency of the plane oriented liquid crystals and increasing light transmission efficiency. The ADS technology has advantages of wide view angle, high aperture ratio, low color difference, low response time, no push Mura, however, the current ADS product also has disadvantages such as low transmissivity, crosstalk, and flicker generally, which influences display quality of the product.

SUMMARY OF THE INVENTION

Embodiments of the present invention provide an array substrate and a manufacturing method thereof, a display device, which can increase transmittance of a product, and also has improving effect to defects such as crosstalk and flicker.

In order to achieve the purposes, embodiments of the present invention adopt the following technical solutions:

On the one hand, an embodiment of the present invention provides an array substrate comprising: a substrate, and a data line, a gate line, a thin film transistor and a pixel electrode formed on the substrate, the thin film transistor comprising a gate insulating layer, a part of the gate insulating layer corresponding to a light-transmissive area of a pixel being removed.

Further, the array substrate further comprises: a passivation layer, a part of the passivation layer corresponding to the light-transmissive area of the pixel being removed.

Further, a film compactness of the gate insulating layer is increased.

Specifically, distribution areas of the gate insulating layer and the passivation layer at least include distribution areas of the data line, the gate line and the thin film transistor.

Further, a distance from an edge of the gate insulating layer to the gate line and a distance from an edge of the passivation layer to the gate line are both not less than 2 μm, and a distance from an edge of the gate insulating layer to the data line and a distance from an edge of the passivation layer to the data line are both not less than 2 μm.

Further, the pixel electrode is lapped on a drain of the thin film transistor directly.

An embodiment of the present invention further provides a display device, which may comprise the above array substrate.

On the other hand, an embodiment of the present invention further provides a manufacturing method of an array substrate, comprising: forming a data line, a gate line, a thin film transistor and a pixel electrode on a substrate, wherein forming the thin film transistor comprises forming a gate insulating layer, a part of the gate insulating layer corresponding to a light-transmissive area of a pixel is removed.

Further, the manufacturing method of an array substrate further comprises: forming a passivation layer, a part of the passivation layer corresponding to the light-transmissive area of the pixel being removed.

Further, forming the gate insulating layer comprises increasing a film compactness of the gate insulating layer.

The array substrate and the manufacturing method thereof, as well as the display device provided by embodiments of the present invention remove the part of the gate insulating layer corresponding to the light-transmissive area of the pixel, such that transmittance of the light-transmissive area of the pixel is increased, thereby increasing transmittance of the product; the increase of the transmittance can also make up insufficiency of the charge level. On the other hand, the defects such as crosstalk and flicker are mainly caused by increase of carriers due to illumination effect to the active layer of the thin film transistor that controls loading of a display signal. Since the increase of the transmittance achieved by the solutions of the present invention can reduce the required charge level (the charge level is influenced by the wide length ratio (W/L) of the channel of the thin film transistor), the active layer can be reduced intentionally in design, thereby avoiding the active layer from being influenced by illumination effect which may result in increase of carriers. Therefore, the solutions of the present invention also have improving effect to defects such as crosstalk and flicker.

BRIEF DESCRIPTION OF DRAWINGS

In order to explain technical solutions in embodiments of the present invention more clearly, the drawings to be used in the embodiments will be introduced briefly next, apparently, the drawings described below are only some embodiments of the present invention, the ordinary skilled person in the art can also obtain other drawings based on these drawings.

REFERENCE NUMBERS

10—substrate, 11—data line, 12—gate line, 13—thin film transistor, 14—pixel electrode, 130—gate,
131—gate insulating layer, 132—active layer, 133—drain, 15—passivation layer, 16—common electrode.

DETAILED DESCRIPTION OF THE INVENTION

Next, technical solutions in embodiments of the present invention will be described clearly and completely in combination with the drawings in the embodiments of the present invention, apparently, the described embodiments are only a part rather than all of embodiments of the present invention.

Figure 1:
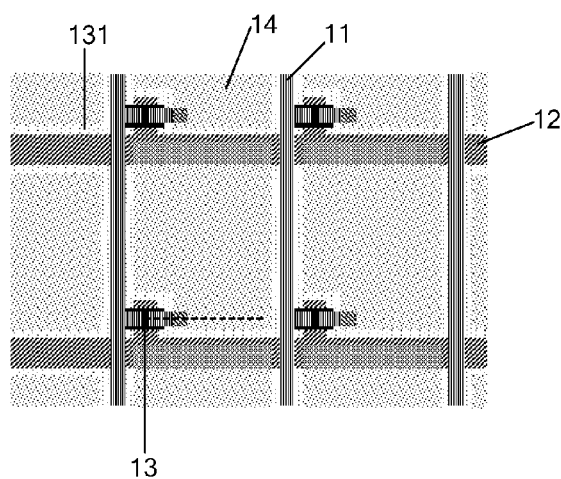
FIG. 1 is a vertical schematic view of structure of a TN-type array substrate provided by an embodiment of the present invention.
Figure 2:
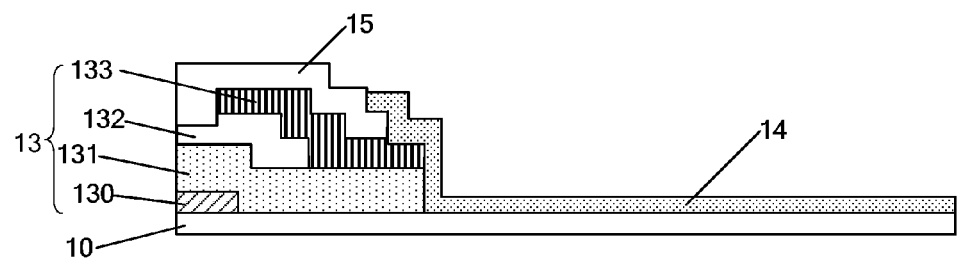
FIG. 2 is a sectional schematic view of structure of a TN-type array substrate provided by an embodiment of the present invention.

An embodiment of the present invention provides an array substrate, as shown in FIG. 1 and FIG. 2, the array substrate comprises: a substrate 10, and a data line 11, a gate line 12, a thin film transistor 13 and a pixel electrode 14 formed on the substrate 10.

Figure 3:
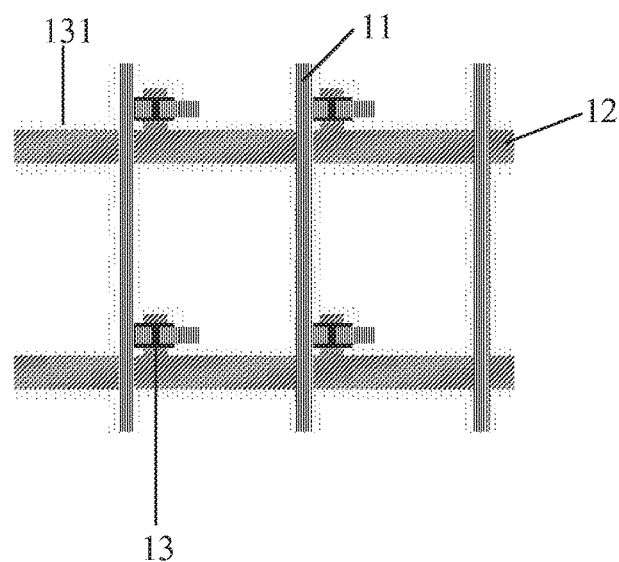
FIG. 3 is a vertical schematic view of structure of a gate insulating layer in an embodiment of the present invention.

FIG. 2 is a sectional schematic view of structure of the array substrate of FIG. 1 along the dashed line direction in FIG. 1. FIG. 3 is a vertical schematic view of structure of a gate insulating layer of the array substrate of FIG. 1. For the sake of simplification, FIG. 2 only shows a part of the thin film transistor. As shown in FIG. 2 and FIG. 3, the thin film transistor 13 comprises a gate insulating layer 131, a part of the gate insulating layer 131 corresponding to a light-transmissive area of a pixel being removed. The thin film transistor 13 may further comprise a gate 130, an active layer 132 as well as a source, a drain 133.

Figure 4:
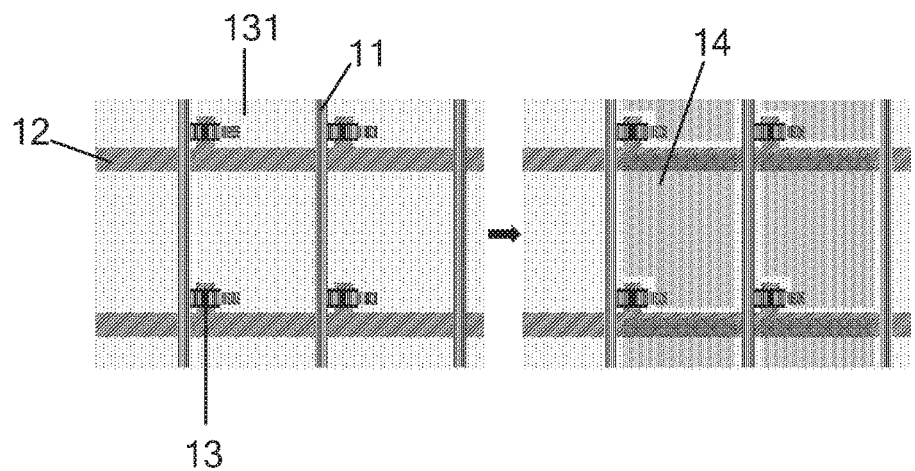
FIG. 4 is a vertical schematic view of structure of a TN-type array substrate in the prior art before (left figure) and after (right figure) a pixel electrode is formed.
Figure 5:
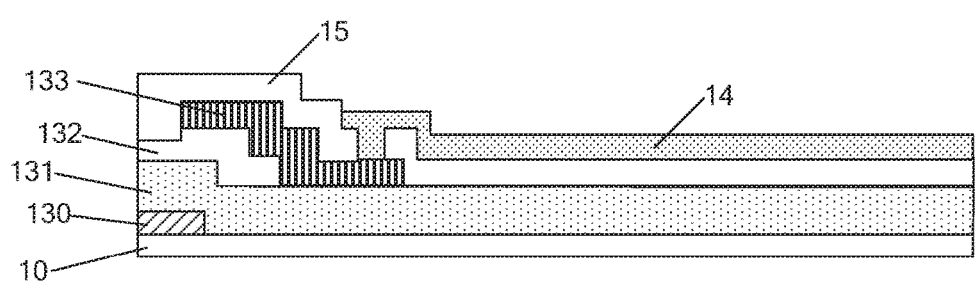
FIG. 5 is a sectional schematic view of structure of a TN-type array substrate in the prior art.

In order to explain the array substrate according to the embodiment of the present invention more clearly, it will be compared with the array substrate in the prior art below. As shown in FIG. 4 and FIG. 5, in the prior art, when forming the gate insulating layer 131 of the thin film transistor, an insulating film covering the entire substrate is generally formed. In the area outside the thin film transistor 13, the gate insulating layer 131 is mainly used for separating the films above and below the gate insulating layer 131, so as to enable the two to be insulated. For example, in the area where the data line 11 and the gate line 12 overlap, the film below the gate insulating layer is a gate metal layer, the film above is a source drain metal layer, the gate insulating layer is used for insulating the gate metal layer and the source drain metal layer. However, actually, the light-transmissive area of the pixel does not need the insulating function of the gate insulating layer. Hence, according to the embodiment of the present invention, the part of the gate insulating layer 131 corresponding to the light-transmissive area of the pixel is removed, thereby enabling the pixel electrode 14 to be formed on the substrate 10 directly, so as to increase transmittance.

FIG. 3 is a vertical schematic view of the gate insulating layer 131 according to an embodiment of the present invention. As shown in FIG. 3, the part of the gate insulating layer 131 corresponding to the light-transmissive areas of respective pixels is removed (or hollowed). A light-transmissive area of a pixel refers to the area in the pixel that needs light to pass through. More specifically, the light-transmissive area of the pixel may be an area located outside the thin film transistor and covered by the pixel electrode 14 within the pixel enclosed by the gate line and the data line. Of course, the skilled person in the art can understand that in specific design, the other parts of the gate insulating layer 131 should ensure that electrical connections not required in the design will not occur to the pixel electrode 14 and the data line 11, the gate line 12, the gate 130 of the thin film transistor 13 etc. Further, the hollowing design of the gate insulating layer can be performed in the light-transmissive area of all or part of the pixels in a plurality of pixels, so as to adjust the distribution of transmittance on the entire display panel.

The array substrate provided by this embodiment removes the part of the gate insulating layer corresponding to the light-transmissive area of the pixel, such that the transmittance of the light-transmissive area of the pixel is increased, thereby increasing transmittance of the product; the increase of the transmittance can also make up insufficiency of the charge level. On the other hand, the increase of the transmittance can reduce the required charge level (the charge level is influenced by the wide length ratio (W/L) of the channel of the thin film transistor), in this way, the active layer can be reduced intentionally in design, thereby avoiding the active layer from being influenced by illumination effect which may result in increase of carriers. Therefore, the solution of the present invention also has improving effect to defects such as crosstalk and flicker.

Further, the above array substrate may further comprise: a passivation layer 15. When a light-transmissive area of a pixel does not need the insulating function of the passivation layer 15, a part of the passivation layer 15 corresponding to the light-transmissive area of the pixel may also be removed (or hollowed), thereby increasing the transmittance of the product further. The position of the removed part of the passivation layer 15 is similar as the gate insulating layer, which may refer to FIG. 3.

Further, one or more methods of increasing film compactness can be used when fabricating the gate insulating layer 131, thereby enabling the film compactness of the obtained gate insulating layer 131 to be increased. There are various methods of increasing the film compactness, such as changing gas flow in deposition, depositing pressure or depositing power and so on, which will not be defined in the present invention. The increase of the film compactness can reduce the transmittance of the gate insulating layer 131. Provided that micro-shift occurs to the active layer 132, the compact gate insulating layer 131 can prevent an end of the active layer 132 from being influenced by illumination so as to result in crosstalk phenomenon (the illumination here may be backlight), thereby improving defects such as crosstalk and flicker, and improving display quality of the product.

In order to enable the skilled person in the art to understand the structure of the array substrate provided by the embodiment of the present invention better, the array substrate provided by the present invention will be explained in more details through specific embodiments in the following.

According to the first implementing mode of this embodiment, an array substrate suitable for the twisted nematic (TN) type product is provided, as shown in FIG. 1 and FIG. 2. The array substrate may comprise: a substrate 10, a data line 11, a gate line 12, a thin film transistor 13 and a pixel electrode 14 formed on the substrate 10. The thin film transistor 13 may comprise a gate 130, a gate insulating layer 131, an active layer 132 and a source, a drain 133. For convenience of understanding, it will be described below by comparing with the existing TN-type array substrate as shown in FIG. 4 and FIG. 5. In the existing TN-type array substrate, the gate insulating layer 131 and the passivation layer 15 cover the entire substrate, and the pixel electrode 14

(e.g., a pixel electrode formed by the ITO layer) contacts with the drain 133 of the thin film transistor 13 through a via hole that penetrates the passivation layer 15. Whereas in the current implementing mode, the part of the gate insulating layer 131 corresponding to the light-transmissive area of the pixel is removed. Further, the gate insulating layer 131 and the passivation layer 15 at least cover the distribution areas of the gate line, the data line and the thin film transistor, moreover, the distance from the edge of the gate insulating layer 131 and the edge of the passivation layer 15 to the edge of the data line/the gate line are not less than 2 μm.

For example, the parts of the gate insulating layer 131 and the passivation layer 15 located in the light-transmissive area of the pixel can be etched through wet or dry etching method, the distance from the etching edge to the data line 11 or the gate line 12 is not less than 2 μm. Thus it can be ensured that the data line 11 and the gate line 12 are protected completely, so as to avoid electric leakage caused by short connection, and achieve increase of the transmittance at the same time. Further, the pixel electrode can be lapped on the drain 133 of the thin film transistor 13 directly. Compared with the method of contacting through a via hole in the prior art, such a connecting mode is more reliable, because it avoids abnormal display phenomenon (AD phenomenon) caused by poor contact of the via hole.

The patterns of the above gate insulating layer 131 and the passivation layer 15 are consistent, wherein the parts corresponding to the light-transmissive area of the pixel are both removed. More specifically, the distribution areas of the gate insulating layer 131 and the passivation layer 15 at least comprise the distribution areas of the data line 11, the gate line 12 and the thin film transistor 13. The gate insulating layer 131 and the passivation layer 15 can be etched and fabricated separately. The patterns of the gate insulating layer 131 and the passivation layer 15 can also be fabricated together through etching process after the film forming process of the passivation layer 15.

In addition, the patterns of the above gate insulating layer 131 and the passivation layer 15 can also be inconsistent. More specifically, the fabricating process is as follows: forming a gate metal layer comprising the gate 130 and the gate line 12 firstly; forming the gate insulating layer 131 on the gate metal layer and patterning it, the distribution area of the patterned gate insulating layer 131 at least comprising the distribution areas of the gate line 12 and the active layer of the thin film transistor 13 to be formed; then, forming the active layer 132; thereafter, forming a source drain metal layer comprising the source and the drain 133; forming the passivation layer 15 on the source drain metal layer and patterning it, the distribution area of the patterned passivation layer 15 at least comprising the distribution areas of the data line 11, the source and the drain 133 of the thin film transistor 13.

Figure 6:
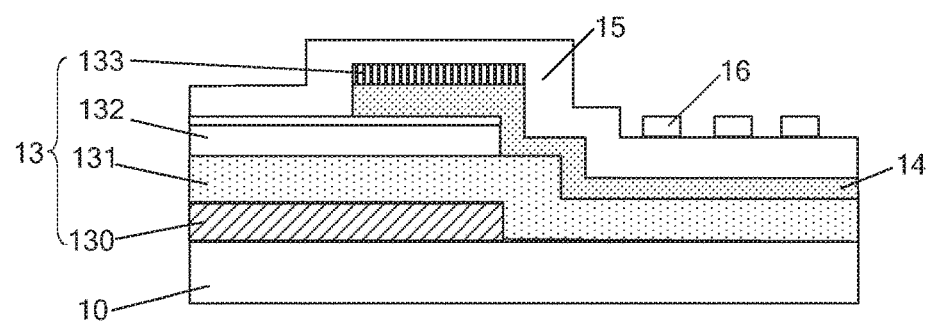
FIG. 6 is a sectional schematic view of structure of an ADS-type array substrate in the prior art.
Figure 7:
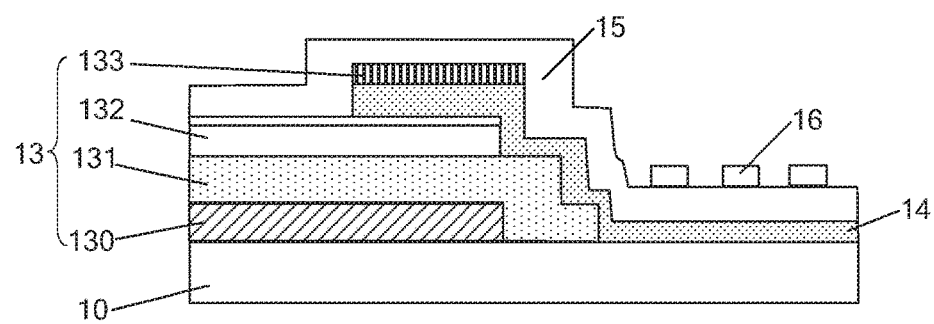
FIG. 7 is a sectional schematic view of structure of an ADS-type array substrate provided by an embodiment of the present invention.

The second implementing mode of this embodiment provides an array substrate suitable for the advanced-super dimensional switching (ADS) product. FIG. 6 is a sectional view of the ADS-type array substrate in the prior art, FIG. 7 is a sectional view of the ADS-type array substrate in the implementing mode of the present invention. In the present implementing mode, the part of the gate insulating layer 131 corresponding to the light-transmissive area of the pixel can also be etched, the distance from the etching edge to the data line 11 (or the gate line 12) is not less than 2 μm, this distance can ensure that the data line 11 (or the gate line 12) is protected completely and can increase transmittance. For the ADS-type array substrate, the passivation layer 15 is required to separate the pixel electrode 14 from the common electrode 16, so as to ensure the two to be insulated, hence, the passivation 15 is not etched and keeps the original whole layer distributing mode.

In the array substrate mentioned in the above specific implementing mode, one or more methods of increasing film compactness can also be used when forming the film of the gate insulating layer 131, such as optimizing the gas flow in deposition, depositing pressure or depositing power and so on, so as to reduce the transmittance of the gate insulating layer 131. In this way, when micro-shift occurs to the active layer 132, it can prevent an end of the active layer from being influenced by illumination so as to result in crosstalk phenomenon, thereby improving defects such as crosstalk and flicker, and improving display quality of the product.

The above two of etching the gate insulating layer 131 (or both the gate insulating layer 131 and the passivation layer 15) in order to increase the transmittance and increasing the compactness of the gate insulating layer 131 supplement each other, solve the problems of low transmittance generally existing in the display product and defects such as crosstalk and flicker together, and improve the display quality of the product.

An embodiment of the present invention also provides a display device, which may comprise any of the above array substrates. The display device has a high transmittance, can improve defects such as crosstalk and flicker, and can obtain higher display quality, moreover, it requires a low charge level, which can meet the requirement of energy saving easily. The display device may be any product or component with the display function, such as a liquid crystal panel, electronic paper, an OLED panel, a mobile phone, a tablet computer, a television, a display, a lap top, a digital photo frame and a navigator, etc.

On the other hand, an embodiment of the present invention further provides a manufacturing method of an array substrate, comprising: forming a data line, a gate line, a thin film transistor and a pixel electrode on a substrate, wherein, forming the thin film transistor comprises forming a gate insulating layer, a part of the gate insulating layer corresponding to a light-transmissive area of a pixel is removed. Through said method, the transmittance can be increased, the defects such as crosstalk and flicker can be improved, thereby the display quality of the product can be improved.

Further, the manufacturing method of the array substrate may further comprise forming a passivation layer, a part of the passivation layer corresponding to the light-transmissive area of the pixel being removed. Thus, the transmittance of the product can be further increased.

In the above process of forming the gate insulating layer or forming the passivation layer, the film can be formed firstly, then the wet or dry etching process is selected based on the material of the gate insulating layer or the passivation layer to etch the part of the gate insulating layer or the passivation layer corresponding to the light-transmissive area of the pixel (for example, the corresponding parts of the gate insulating layer and the passivation layer can be etched once through the same process); and printing or film forming by masking can also be used to directly form the required gate insulating layer or the passivation layer hollowed in the light-transmissive area of the pixel; and any mode that is well known by the skilled person in the art can also be used, which will not be defined in the present invention.

Further, one or more methods of increasing the film compactness can be used in the process of forming the gate insulating layer. The compact gate insulating layer 131 improves defects such as crosstalk and flicker caused by illumination effect to the active layer 132, and improves the display quality of the product.

By means of the manufacturing method of the array substrate provided by this embodiment, the part of the gate insulating layer corresponding to the light-transmissive area of the pixel can be removed, thereby increasing transmittance of the product; on the other hand, by using the method of increasing the film compactness in the film forming process of the gate insulating layer, the defects such as crosstalk and flicker can be improved, thereby improving the display quality of the product.

It should be noted that, although the array substrate and the display device according to the above embodiments can be applied in the liquid crystal display technology, the application of the present invention is not limited to this.

What are stated above are only specific implementing modes of the present invention, however, the protection scope of the present invention is not limited to this. Any modifications or replacements that the skilled person familiar with the present technical field can easily think of within the technical scope disclosed by the present invention should be encompassed within the protection scope of the present invention. Therefore, the protection scope of the present invention should be based on the protection scopes of claims.

The invention claimed is:

1. An array substrate comprising: a substrate, and a data line, a gate line, a thin film transistor and a pixel electrode formed on the substrate, the thin film transistor comprising a gate insulating layer, wherein,
   a part of the gate insulating layer corresponding to a light-transmissive area of a pixel is removed,
   wherein the pixel electrode covers a side face and part of top surface of a drain of the thin film transistor and is in direct contact with the drain,
   wherein the array substrate further comprises: a passivation layer, wherein a part of the passivation layer corresponding to the light-transmissive area of the pixel is removed,
   wherein distribution areas of the gate insulating layer and the passivation layer at least include distribution areas of the data line, the gate line and the thin film transistor, and
   wherein a distance from an edge of the gate insulating layer to the gate line and a distance from an edge of the passivation layer to the gate line are both not less than 2 µm, and a distance from an edge of the gate insulating layer to the data line and a distance from an edge of the passivation layer to the data line are both not less than 2 µm.

2. The array substrate according to claim 1, wherein a film compactness of the gate insulating layer has been increased by changing gas flow, depositing pressure or depositing power in deposition of the gate insulating layer.

3. A display device comprising an array substrate, the array substrate comprising: a substrate, and a data line, a gate line, a thin film transistor and a pixel electrode formed on the substrate, the thin film transistor comprising a gate insulating layer, wherein,
   a part of the gate insulating layer corresponding to a light-transmissive area of a pixel is removed,
   wherein the pixel electrode covers a side face and part of top surface of a drain of the thin film transistor and is in direct contact with the drain,
   wherein the array substrate further comprises: a passivation layer, wherein a part of the passivation layer corresponding to the light-transmissive area of the pixel is removed,
   wherein distribution areas of the gate insulating layer and the passivation layer at least include distribution areas of the data line, the gate line and the thin film transistor, and
   wherein a distance from an edge of the gate insulating layer to the gate line and a distance from an edge of the passivation layer to the gate line are both not less than 2 µm, and a distance from an edge of the gate insulating layer to the data line and a distance from an edge of the passivation layer to the data line are both not less than 2 µm.

4. A manufacturing method of an array substrate, comprising: forming a data line, a gate line, a thin film transistor and a pixel electrode on a substrate, wherein,
   forming the thin film transistor comprises forming a gate insulating layer, a part of the gate insulating layer corresponding to a light-transmissive area of a pixel is removed,
   wherein the pixel electrode covers a side face and part of top surface of a drain of the thin film transistor and is in direct contact with the drain,
   wherein the method further comprises: forming a passivation layer, a part of the passivation layer corresponding to the light-transmissive area of the pixel being removed,
   wherein distribution areas of the gate insulating layer and the passivation layer at least include distribution areas of the data line, the gate line and the thin film transistor, and
   wherein a distance from an edge of the gate insulating layer to the gate line and a distance from an edge of the passivation layer to the gate line are both not less than 2 µm, and a distance from an edge of the gate insulating layer to the data line and a distance from an edge of the passivation layer to the data line are both not less than 2 µm.

5. The manufacturing method according to claim 4, wherein forming the gate insulating layer comprises increasing a film compactness of the gate insulating layer by changing gas flow, depositing pressure or depositing power in deposition of the gate insulating layer.

6. The display device according to claim 3, wherein a film compactness of the gate insulating layer has been increased by changing gas flow, depositing pressure or depositing power in deposition of the gate insulating layer.

* * * * *